(12) United States Patent
Schuegraf

(10) Patent No.: US 6,534,802 B1
(45) Date of Patent: Mar. 18, 2003

(54) METHOD FOR REDUCING BASE TO COLLECTOR CAPACITANCE AND RELATED STRUCTURE

(75) Inventor: Klaus F. Schuegraf, Aliso Viejo, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/850,028

(22) Filed: May 7, 2001

(51) Int. Cl.[7] .............................................. H01L 29/739
(52) U.S. Cl. ........................ 257/194; 257/197; 438/235
(58) Field of Search ................................. 257/194, 565, 257/573, 197; 438/318, 235; 437/31, 32

(56) References Cited

U.S. PATENT DOCUMENTS 5,399,511 A * 3/1995 Taka et al. ..................... 437/31
5,633,179 A * 5/1997 Kamins et al. ............. 438/318
5,798,277 A * 8/1998 Ryum et al. ................... 437/31
6,177,717 B1 * 1/2001 Chantre et al. ............. 257/565
6,285,044 B1 * 9/2001 Bhat .......................... 257/197

* cited by examiner

Primary Examiner—David Nelms
Assistant Examiner—Thinh T. Nguyen
(74) Attorney, Agent, or Firm—Farjami & Farjami LLP (57) ABSTRACT

According to a disclosed embodiment, a transistor region comprising a collector region is opened adjacent to an oxide region. The oxide region may be, for example, a field oxide region. Additionally, an extrinsic collector region is formed under the oxide region. A blanket layer of dielectric is deposited over the transistor region and the oxide region. The blanket layer of dielectric can comprise, for example, silicon dioxide. The blanket layer of dielectric is etched away from the transistor region, leaving behind a dielectric segment on the oxide region. Following, a base region comprising, for example, single-crystal silicon-germanium, is grown over the collector region. Concurrently, a conductive region that is electrically connected to the base region is formed over the oxide region. The dielectric segment on the oxide region increases the separation between the conductive region and the extrinsic collector region, thus lowering the base to collector capacitance.

22 Claims, 5 Drawing Sheets

METHOD FOR REDUCING BASE TO COLLECTOR CAPACITANCE AND RELATED STRUCTURE

BACKGROUND OF THE INVENTION

1. Field of the Invention

The present invention is generally in the field of fabrication of semiconductor devices. More particularly, the present invention is in the field of fabrication of heterojunction bipolar transistors.

2. Related Art

In a silicon-germanium ("SiGe") heterojunction bipolar transistor ("HBT"), a thin silicon-germanium layer is grown as the base of a bipolar transistor on a silicon wafer. The silicon-germanium HBT has significant advantages in speed, frequency response, and gain when compared to a conventional silicon bipolar transistor. Cutoff frequencies in excess of 100 GHz, which are comparable to the more expensive gallium-arsenide based devices, have been achieved for the silicon-germanium HBT.

The higher gain, speed and frequency response of the silicon-germanium HBT are possible due to certain advantages of silicon-germanium, such as a narrower band gap and reduced resistivity. These advantages make silicon-germanium devices more competitive than silicon-only devices in areas of technology where superior speed and frequency response are required.

But as with other transistors, excess base to collector capacitance can detrimentally impact the performance of a silicon-germanium HBT transistor, primarily by reducing its speed. The practical effect of a capacitor is that it stores electrical charges that are later discharged, and the extra time required to charge and discharge the excessive capacitance slows down the transistor. Because the benefits of high gain and high speed can be compromised by excess capacitance, it is a goal of silicon-germanium HBT design to reduce such excess capacitance to a minimum. By keeping the base to collector capacitance low, improved transistor performance is achieved.

Capacitance develops, for example, when two plates made of an electrically conducting material are separated by a dielectric such as silicon dioxide ("$SiO_2$"). In general, capacitance is determined by the geometry of the device and is directly proportional to the area of the conductive plates and inversely proportional to the distance, or thickness, separating the two plates. Generally, capacitance is calculated using the equation:

Capacitance (C)=$\epsilon_0 kA/t$       (Equation 1)

where $\epsilon_0$ is the permitivity of free space, k is the dielectric constant of the dielectric separating the two plates, A is the size of the area where the plates overlap one another, and t is the thickness or separation between the two plates. From the Equation (1), it is seen that capacitance could be reduced by the presence of a dielectric with a lower dielectric constant k between the two plates. Alternatively, increasing the separation distance between the two plates, i.e. making the dielectric thicker, could also reduce the capacitance.

Figure 1:
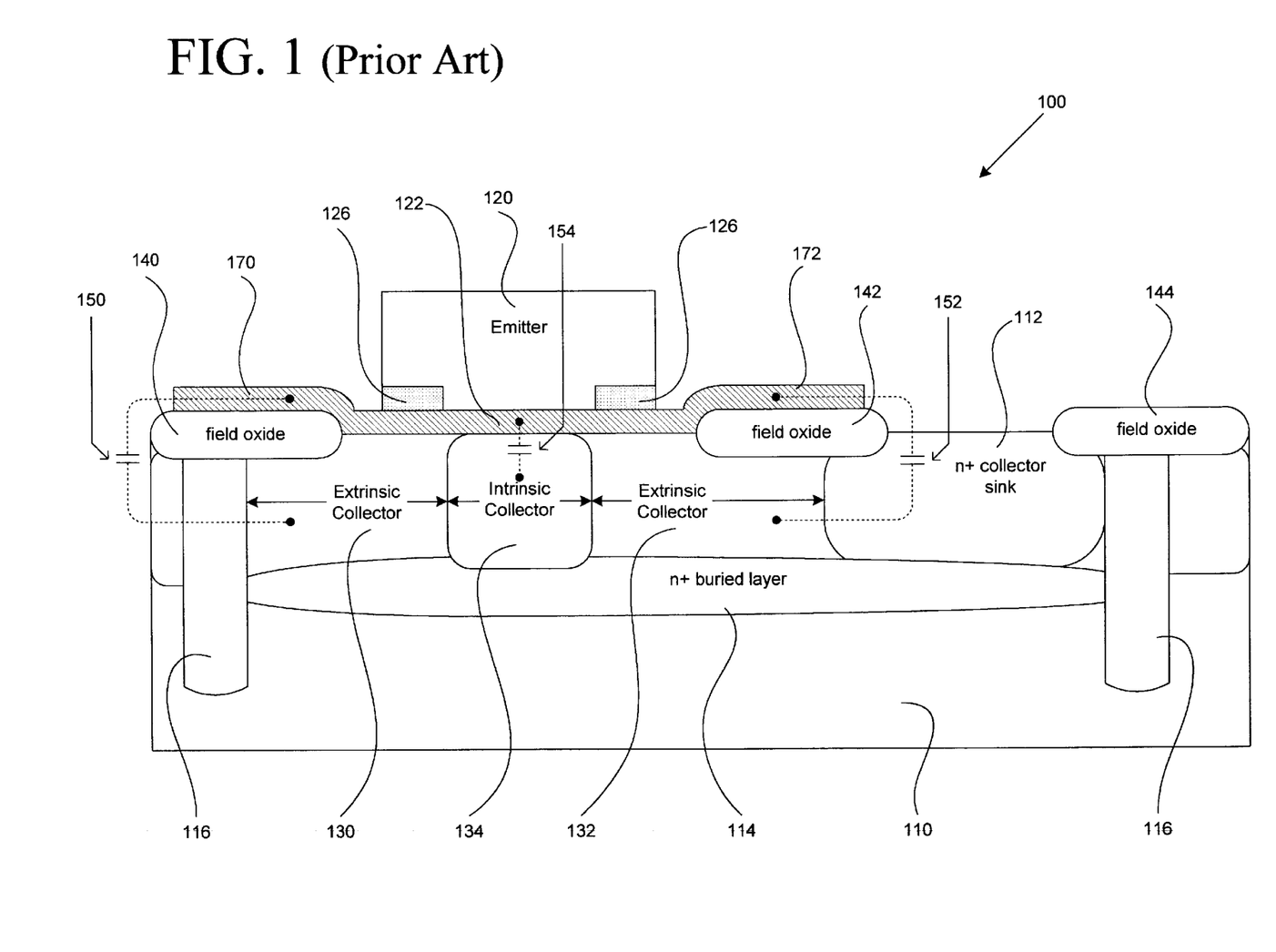
FIG. 1 illustrates a cross sectional view of the features of a HBT fabricated utilizing conventional methods.

FIG. 1 shows an NPN silicon-germanium HBT structure 100, which is used to describe the base to collector capacitance created by conventional silicon-germanium HBT fabrication processes. Certain details and features have been left out of FIG. 1 which are apparent to a person of ordinary skill in the art. Structure 100 includes, among other components, intrinsic collector 134, silicon-germanium base 122, and emitter 120. In exemplary structure 100, intrinsic collector 134 is N type single crystal silicon which can be deposited epitaxially using a reduced pressure chemical vapor deposition ("RPCVD") process. Silicon-germanium base 122 is P type silicon-germanium single crystal deposited epitaxially in a nonselective RPCVD process.

By way of background, because of the nonselective RPCVD process utilized to grow a silicon-germanium layer, the silicon-germanium base as well as other silicon-germanium regions are formed concurrently. The segments of the silicon-germanium layer formed over field oxide region 140 and field oxide region 142 are polycrystalline silicon-germanium and are referred to in this application as polycrystalline silicon-germanium segment 170 and polycrystalline silicon-germanium segment 172. The segment of the silicon-germanium layer that is formed on top of intrinsic collector 134 and extrinsic collector regions 130 and 132, and between field oxide regions 140 and 142 forms the base region of the SiGe HBT and is single-crystal silicon-germanium and is referred to as base 122 or single-crystal silicon-germanium base 122 in the present application.

Polycrystalline silicon-germanium segment 170 and polycrystalline silicon-germanium segment 172 do not function as part of the base of the silicon-germanium HBT but are electrically connected to the base. Situated above base 122 is emitter 120, which forms a junction with base 122 and comprises N type polycrystalline silicon. Extrinsic collector region 130 and extrinsic collector region 132 are situated on each side of intrinsic collector 134. Dielectric sections 126 provide electrical isolation to emitter 120 from base 122. The interface between single-crystal silicon germanium base 122 and intrinsic collector 134, and the interface between single-crystal silicon germanium base 122 and emitter 120 comprise the HBT's active area. Intrinsic collector 134, single-crystal silicon germanium base 122, and emitter 120 thus form the silicon-germanium HBT.

As further seen in FIG. 1, buried layer 114, which is composed of N+ type material, is formed in semiconductor substrate 110. Collector sinker 112, also composed of N+ type material, is formed by diffusion of heavily concentrated dopants from the surface of collector sinker 112 down to buried layer 114. Buried layer 114 and collector sinker 112 provide a low resistance electrical pathway from intrinsic collector 134 through buried layer 114 and collector sinker 112 to a collector contact (not shown). Deep trench structures 116, field oxide region 140, field oxide region 142, and field oxide region 144 provide electrical isolation form other devices on semiconductor substrate 110. Although structure 100 shows field oxide regions 140, 142, and 144, for the purposes of processing a wafer, field oxide region 140, 142, and/or 144 could be composed of other types of isolation regions, for example shallow trench isolation regions, deep trench isolation, or local oxidation of silicon, generally referred to as "LOCOS".

In a silicon-germanium HBT, base to collector capacitance, also referred to as base-collector capacitance in the present application, is between the base and collector regions and comprises intrinsic and extrinsic components. These components of the base-collector capacitance ("$C_{bc}$") are seen in FIG. 1. Intrinsic $C_{bc}$ 154 is between single-crystal silicon germanium base 122 and intrinsic collector 134. Extrinsic $C_{bc}$ 150 is between polycrystalline silicon-germanium segment 170 and extrinsic collector region 130 and through field oxide region 140, while extrinsic $C_{bc}$ 152 is between polycrystalline silicon-germanium segment 172 and extrinsic collector region 132 and through field oxide region 142. Again, polycrystalline silicon-germanium segments 170 and 172 are physically and electrically connected to single-crystal silicon-germanium base 122 but do not function as part of the base. Polycrystalline silicon-germanium segments 170 and 172 overlap extrinsic collector regions 130 and 132 and lead to development of the extrinsic components of the total $C_{bc}$. The total base to collector capacitance ("total $C_{bc}$") for the silicon-germanium HBT in structure 100 is the sum of intrinsic $C_{bc}$ 154, extrinsic $C_{bc}$ 150 and extrinsic $C_{bc}$ 152.

Intrinsic $C_{bc}$ 154 is the junction capacitance inherent in the silicon-germanium HBT device. The capacitance value of intrinsic $C_{bc}$ 154 is determined by various fabrication parameters in the silicon-germanium HBT device and can only be reduced by altering the fabrication parameters and thus the performance of the device itself. As stated above, extrinsic $C_{bc}$ 150 and $C_{bc}$ 152 exist because of the overlap between polycrystalline silicon-germanium segment 170 and polycrystalline silicon-germanium segment 172 with, respectively, extrinsic collector region 130 and extrinsic collector region 132. Polycrystalline silicon-germanium segment 170 and polycrystalline silicon-germanium segment 172 are not part of the SiGe HBT base but are electrically connected to the base.

Extrinsic base to collector capacitance becomes an appreciable portion of total $C_{bc}$ as device geometries are reduced. The reduction in device geometry is naturally accompanied by a reduction in various geometries, such as the thickness of the field oxide. This "thinning" of the field oxide regions lessens the separation, for example, between polycrystalline silicon-germanium segment 170 and polycrystalline silicon-germanium segment 172 from, respectively, extrinsic collector region 130 and extrinsic collector region 132 and therefore increases the level of extrinsic base to collector capacitance.

Various methods aimed at reducing the total $C_{bc}$ have been introduced. Unfortunately, these methods have not produced the level of capacitance reduction desired or, in other instances, are impractical to implement. For example, one conventional method utilized to try to reduce extrinsic $C_{bc}$ components employs a relatively thick oxide isolation segment, or LOCOS segment. However, thick LOCOS is difficult to fabricate, particularly in light of the need to accommodate device geometry scaling. Another conventional method involves reducing the area of the base and collector junction, or the base to collector interface, to reduce the intrinsic base to collector capacitance. But altering the device geometry would require otherwise unnecessary alterations in the device fabrication process and would also compromise the device's performance.

There is thus a need in the art for method of HBT fabrication that reduces the base to collector capacitance. More particularly, there is a need for a method that will limit the total $C_{bc}$ without adversely impacting the HBT device geometry or diminishing its performance. Further, there is a need in the art for a method which is practical to implement and which will significantly reduce the total $C_{bc}$.

SUMMARY OF THE INVENTION

The present invention is directed to method for controlling the base to collector capacitance ("$C_{bc}$") and related structure. The invention results in a heterojunction bipolar transistor ("HBT") with a collector to base capacitance which is lower than that of similar devices fabricated utilizing conventional methods. Further, the invention achieves the reduction without adversely impacting the HBT device geometry or impacting its performance and is practical to implement.

According to one embodiment of the invention, a transistor region comprising a collector region is opened adjacent to an oxide region. In one embodiment of the invention, the oxide region comprises, for example, a field oxide region, a shallow trench isolation, or a LOCOS region. An extrinsic collector region is also formed under the oxide region. Thereafter, a blanket layer of dielectric is deposited over the transistor region and the oxide region. The blanket layer of dielectric can comprise, for example, silicon dioxide, silicon nitride, a low-k dielectric, or other suitable dielectric material. The blanket layer of dielectric is subsequently etched away from the transistor region.

Next, a base region is grown over the collector region. As an example, the base region can comprise single-crystal silicon-germanium grown by a reduced pressure chemical vapor deposition process. Concurrently, a conductive region is formed over the oxide region. The conductive region can comprise, for example, polycrystalline silicon-germanium and is electrically connected to the base region. Following formation of the base region, an emitter region is fabricated on the base region and forms a junction with the base region.

The presence of the dielectric layer on top of the oxide region increases the separation between the conductive region and the extrinsic collector region. The increased separation translates to a reduction in the total base to collector capacitance.

DETAILED DESCRIPTION OF THE INVENTION

The present invention is directed to method for reducing base to collector capacitance and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 2:
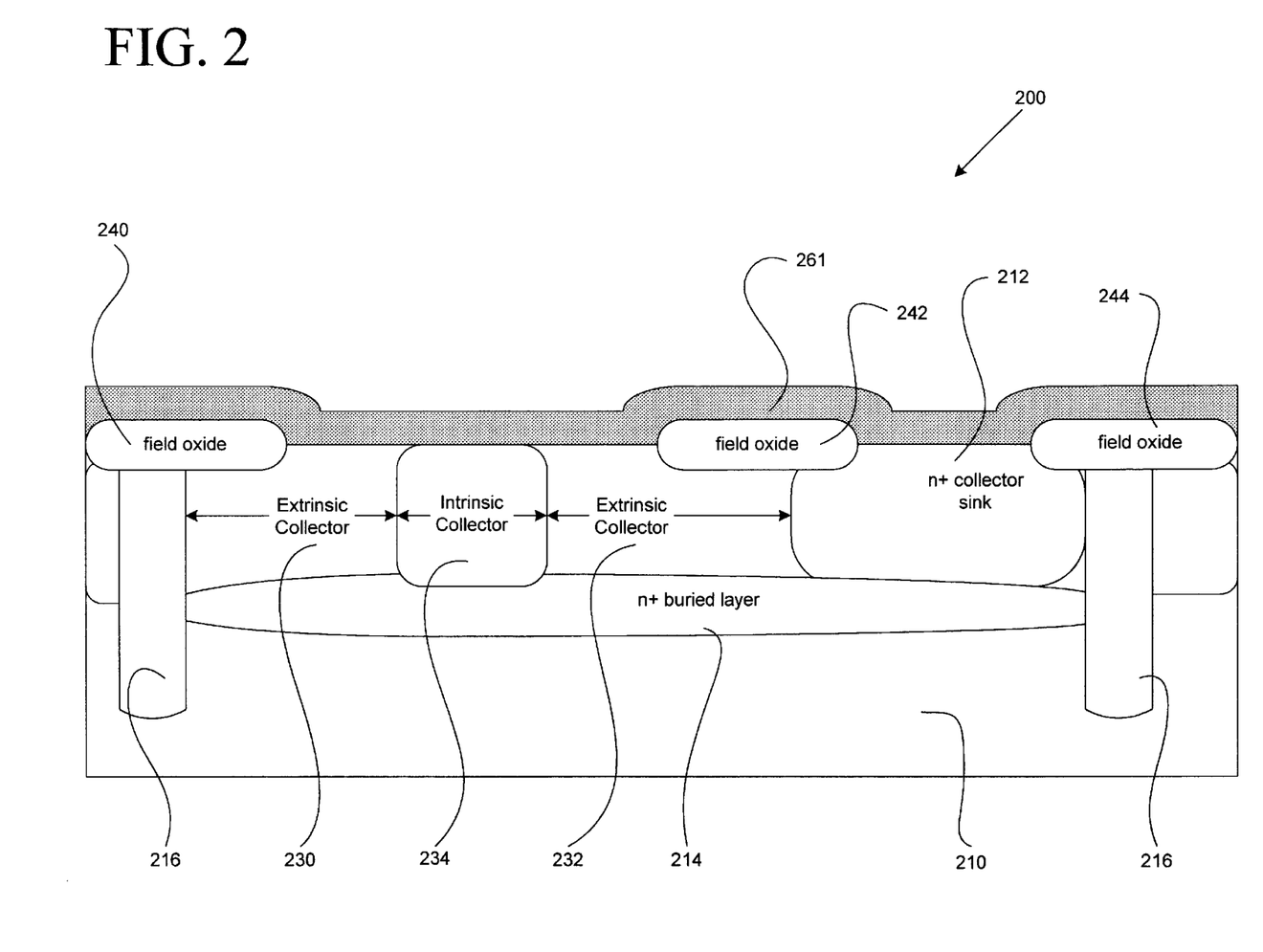
FIG. 2 illustrates a cross sectional view of some of the features of an HBT in an intermediate stage of fabrication, formed in accordance with one embodiment of the present invention.

FIG. 2 shows an NPN silicon-germanium ("SiGe") heterojunction bipolar transistor ("HBT") structure 200 which is used to describe one embodiment of the present invention. Certain details and features have been left out of FIG. 2 which are apparent to a person of ordinary skill in the art. Structure 200 shows the silicon-germanium HBT in an intermediate stage of fabrication. Structure 200 includes, among other components, intrinsic collector 234, which is N type single crystal silicon and which can be formed using a dopant diffusion process in a manner known in the art. Structure 200 also shows that extrinsic collector region 230 and extrinsic collector region 232 are on each side of intrinsic collector 234.

As seen in FIG. 2, buried layer 214, which is composed of N+ type material—meaning that it is relatively heavily doped N type material—is formed in semiconductor substrate 210 in a manner known in the art. Collector sinker 212 also composed of N+ type material, is formed by diffusion of heavily concentrated dopants from the surface of collector sinker 212 down to buried layer 214. Buried layer 214, along with collector sinker 212 provide a low resistance electrical pathway from intrinsic collector 234 through buried layer 214 and collector sinker 212 to a collector contact (not shown).

Continuing with FIG. 2, deep trench structures 216 and field oxide region 240, field oxide region 242, and field oxide region 244 are formed in a manner known in the art and provide electrical isolation from other devices on semiconductor substrate 210. Although field oxide region 240, field oxide region 242, and field oxide region 244 comprise silicon dioxide in the present embodiment of the invention, a person skilled in the art will recognize that other materials such as silicon nitride, a low-k dielectric, or other suitable dielectric material may be used instead. Field oxide regions 240, 242, and 244 can also be other forms of isolation, for example local oxidation of silicon ("LOCOS") or shallow trench isolation oxide ("STI"), formed in a manner known in the art. These different forms of isolation, i.e. field oxide, shallow trench isolation oxide, and LOCOS, are also referred to as "oxide regions" in the present application. Thus, although the present embodiment is directed to field oxide regions comprising silicon dioxide, a person skilled in the art will recognize that other suitable types of isolation may be utilized.

It is seen in FIG. 2 that field oxide region 240 and field oxide region 242 are situated above, respectively, extrinsic collector region 230 and extrinsic collector region 232. Further, the region between field oxide regions 240 and 242 is also referred to as a "transistor region" in the present application. FIG. 2 thus shows that structure 200 includes several features and components used to form a silicon-germanium HBT at a stage prior to the formation of a base region and the addition of an emitter region.

As further seen in FIG. 2, a blanket layer of dielectric 261 has been deposited on semiconductor substrate 210 and its various components including field oxide region 240, and field oxide region 242. Blanket layer of dielectric layer 261, or dielectric layer 261, can comprise silicon dioxide, silicon nitride, a low-k dielectric, or other suitable dielectric material. In one embodiment of the present invention, dielectric layer 261 is a silicon dioxide film deposited using a chemical vapor deposition process ("CVD") with tetraethyl orthosilicate ("$SiOC_2H_5$" or "TEOS") as the $SiO_2$ precursor. An alternative to using TEOS is, for example, by reaction of silane ("$SiH_4$") with nitrous oxide in an argon plasma. Dielectric layer 261 can be in the range of approximately 2000 Angstroms to approximately 3000 Angstroms, depending on the dielectric material used.

Figure 3:
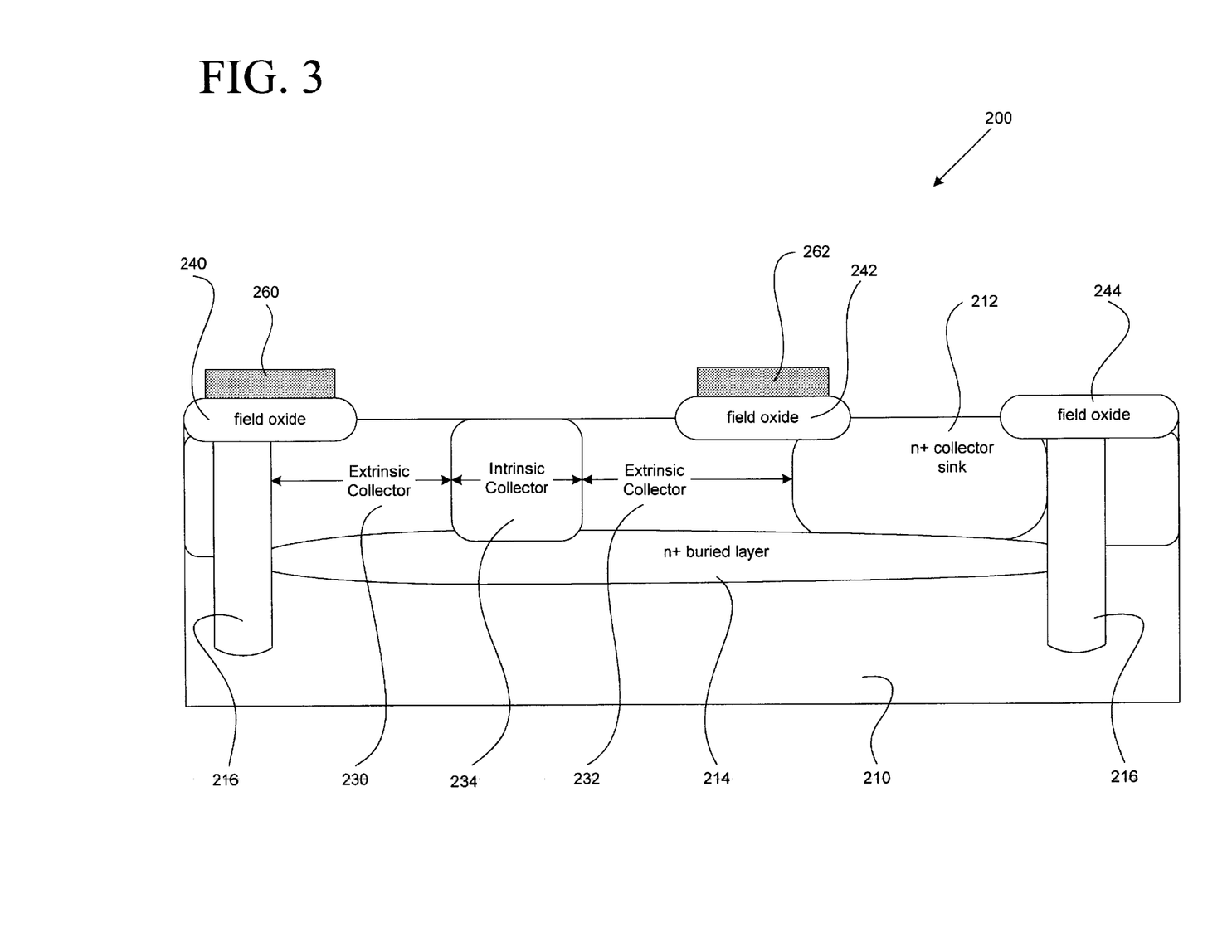
FIG. 3 illustrates a cross sectional view of some of the features of an HBT in an intermediate stage of fabrication formed in accordance with one embodiment of the present invention.

FIG. 3 shows the result following patterning and etching steps which selectively etch dielectric layer 261. Patterning the photoresist and etching dielectric layer 261 is done in a manner known in the art. It is noted in FIG. 3 that dielectric layer 261 has been etched such that dielectric segment 260 and dielectric segment 262, crafted from dielectric layer 261, remain on field oxide region 240 and field oxide region 242. Therefore, in the present embodiment of the invention, dielectric segment 260 and dielectric segment 262 comprise silicon dioxide and remain on, respectively, field oxide regions 240 and 242.

Figure 4:
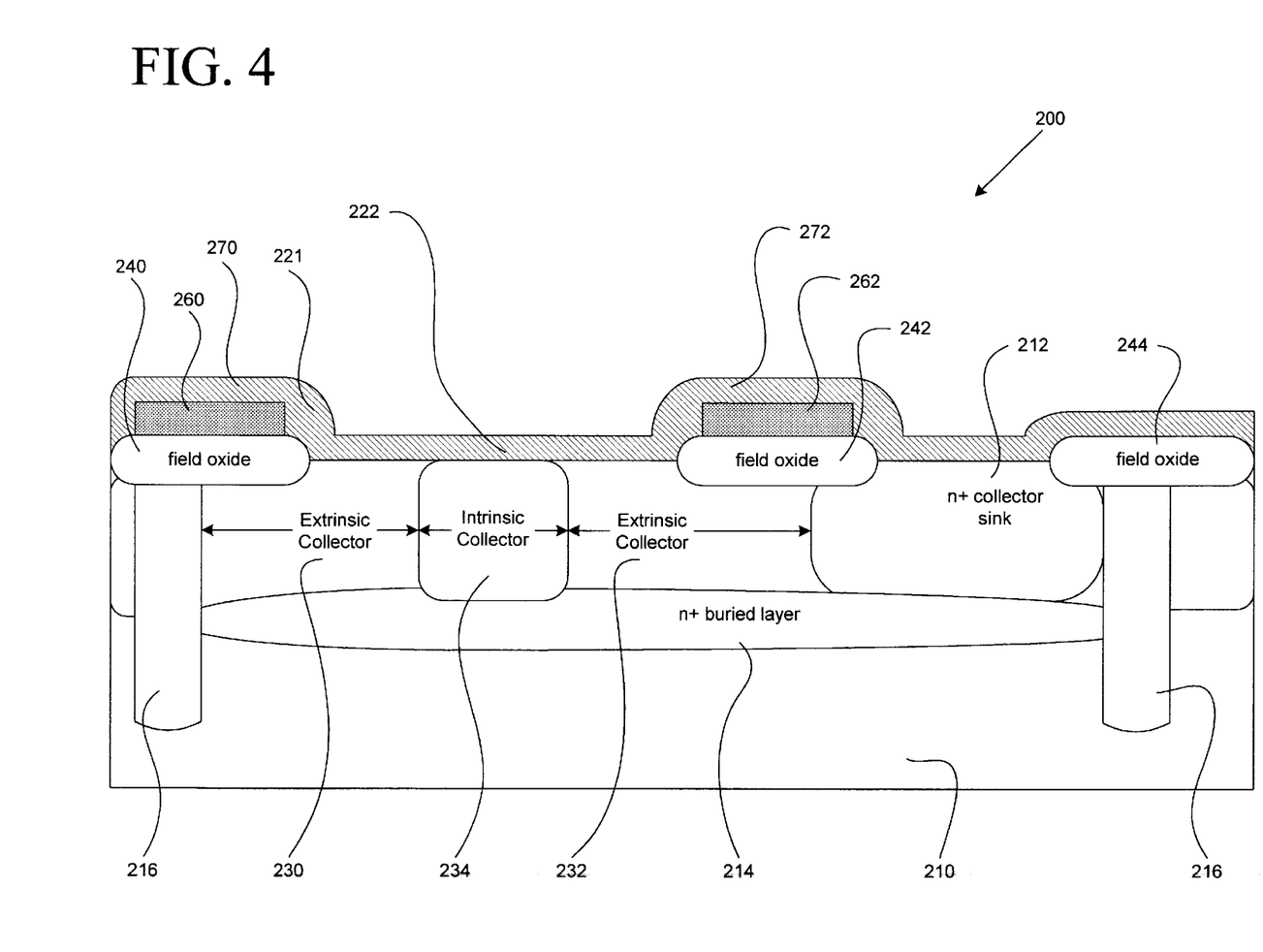
FIG. 4 illustrates a cross sectional view of some of the features of an HBT in an intermediate stage of fabrication, formed in accordance with one embodiment of the present invention.

Referring to FIG. 4, one embodiment of the present invention is directed to growing a silicon-germanium film on semiconductor substrate 210 and its various components including intrinsic collector 234, field oxide region 240, field oxide region 242, dielectric segment 260, and dielectric segment 262. Silicon-germanium film 221 is grown on intrinsic collector 234 to serve as the base for the silicon-germanium HBT. Silicon-germanium film 221 can be, for example, P type silicon-germanium deposited epitaxially in a nonselective reduced pressure chemical vapor deposition process ("RPCVD").

In the present embodiment of the invention, silicon-germanium film 221 is formed utilizing RPCVD, and the silicon-germanium base and other silicon-germanium regions are formed concurrently. Silicon-germanium grows differently on different materials and becomes polycrystalline when grown on silicon dioxide and single-crystal when grown on a single-crystal silicon substrate. The segment of silicon-germanium film 221 formed on top of intrinsic collector 234 is single-crystal silicon-germanium and is referred to as single-crystal silicon-germanium base 222 or base 222 in the present application. The segments of silicon-germanium film 221 grown on dielectric segment 260 and dielectric segment 262 are polycrystalline silicon-germanium and are referred to as polycrystalline silicon-germanium segment 270 and polycrystalline silicon-germanium segment 272. Silicon-germanium segment 270 and polycrystalline silicon-germanium segment 272 are also referred to as "conductive regions" in the present application, and single crystal silicon germanium base 222 is also referred to as "base region" in the present application.

Figure 5:
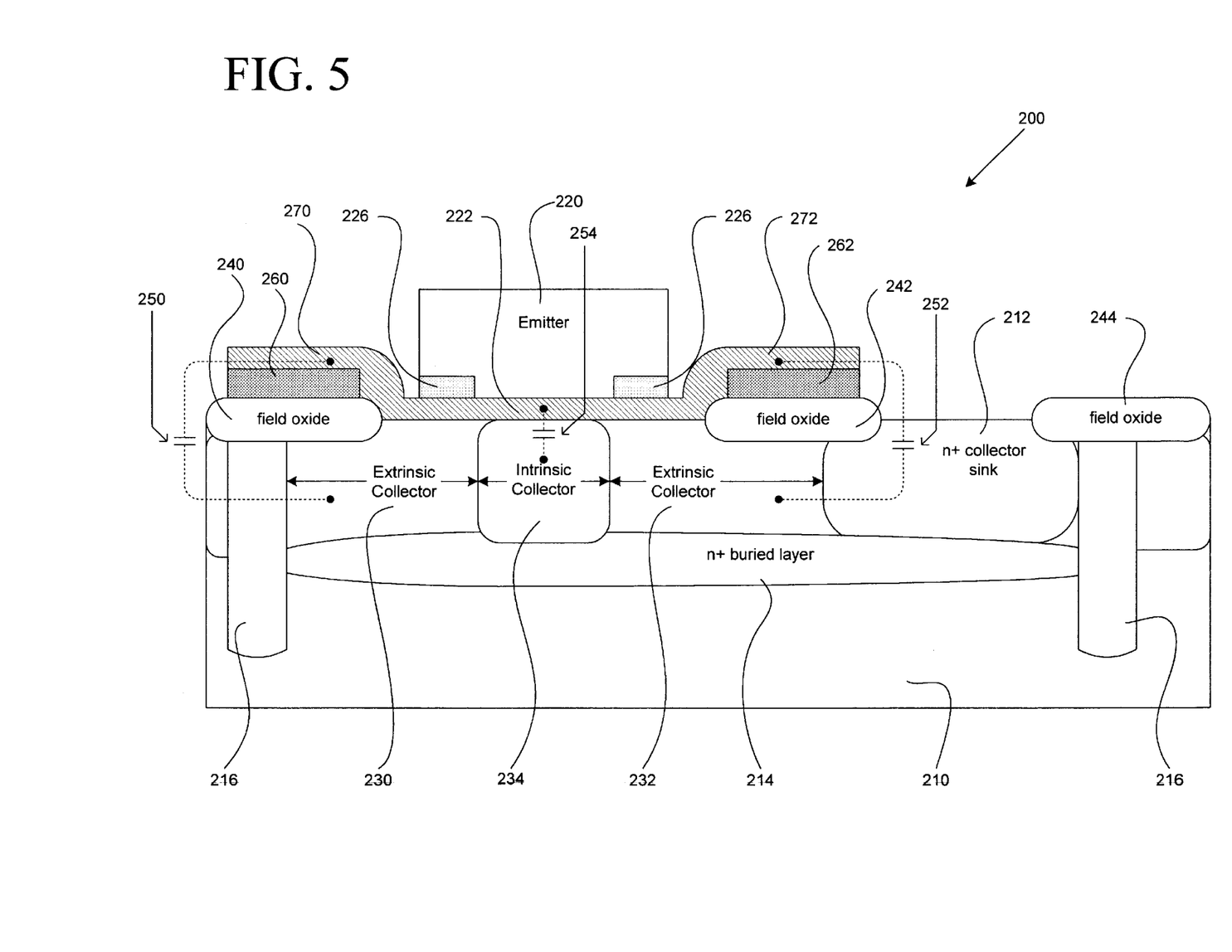
FIG. 5 illustrates a cross sectional view of the features of an HBT fabricated in accordance with one embodiment of the present invention.

FIG. 5 shows the result of subsequent steps in the fabrication of the silicon-germanium HBT. Silicon-germanium film 221 has been etched to form single-crystal silicon-germanium base 222, polycrystalline silicon-germanium segment 270, and polycrystalline silicon-germanium segment 272 in a manner known in the art. Single-crystal silicon-germanium base 222 forms a junction with-intrinsic collector 234. Polycrystalline silicon-germanium segment 270 and polycrystalline silicon-germanium segment 272 remain over, respectively, dielectric segment 260 and dielectric segment 262 and overlap, respectively, extrinsic collector region 230 and extrinsic collector region 232. It is noted that polycrystalline silicon-germanium segment 270 and polycrystalline silicon-germanium segment 272 do not function as part of the silicon-germanium HBT base but are electrically connected to single-crystal silicon-germanium base 222. Polycrystalline silicon-germanium segment 270 and polycrystalline silicon-germanium segment 272 are also referred to as "conductive regions" in the present application.

FIG. 5 also shows that emitter 220, also referred to a "emitter region" in the present application, has been fabricated on single-crystal silicon-germanium base 222 and forms a junction with single-crystal silicon-germanium base 222 directly over intrinsic collector 234. Emitter 220 can comprise N type polycrystalline silicon and is fabricated in a manner known in the art. Also, FIG. 5 shows dielectric sections 226 which provide electrical isolation to emitter 220 from single-crystal silicon-germanium base 222. The junction between single-crystal silicon-germanium base 222, intrinsic collector 234, and emitter 220 comprise the HBT's active area. Single-crystal silicon-germanium base 222, intrinsic collector 234 and emitter 220 thus form the silicon-germanium HBT.

It is further seen in FIG. 5 that the silicon-germanium HBT depicted in structure 200 has intrinsic and extrinsic base to collector capacitance components. Intrinsic $C_{bc}$ 254 is between single-crystal silicon germanium base 222 and intrinsic collector 234. Extrinsic $C_{bc}$ 250 is between polycrystalline silicon-germanium segment 270 and extrinsic collector region 230 through dielectric segment 260 and field oxide region 240. Extrinsic $C_{bc}$ 252 is between polycrystalline silicon-germanium segment 272 and extrinsic collector region 232 through dielectric segment 262 and field oxide region 242. The total base to collector capacitance ("total $C_{bc}$") for the silicon-germanium HBT in structure 200 would thus be the sum of intrinsic $C_{bc}$ 254, extrinsic $C_{bc}$ 250, and extrinsic $C_{bc}$ 252.

The presence of dielectric segment 260 and dielectric segment 262 on, respectively, field oxide region 240 and field oxide region 242 means that the separation between polycrystalline silicon-germanium segment 270 and extrinsic collector region 230, and the separation between polycrystalline silicon-germanium segment 272 and extrinsic collector region 232 are greater than the separation achieved by conventional HBT fabrication methods. The increased separation translates to a lower extrinsic base to collector capacitance value, based on Equation (1):

$$\text{Capacitance (C)} = \epsilon_0 kA/t \qquad \text{(Equation 1)}$$

where $\epsilon_0$ is the permitivity of free space, k is the dielectric constant of the material separating the two plates, A is the area of the overlapping capacitor plates, e.g. the area of overlap between polycrystalline silicon-germanium segment 270 and extrinsic collector 230, and between polycrystalline silicon-germanium segment 272 and extrinsic collector 232, and t is the thickness of the material separating the two plates.

In the present embodiment of the invention, the separation between polycrystalline silicon-germanium segment 270 and extrinsic collector 230, and the separation between polycrystalline silicon-germanium segment 272 and extrinsic collector 232 have been increased due to the added separation introduced by the thickness of dielectric segment 260 and dielectric segment 262. In other words, the thickness t in Equation (1) has increased. Thus, and more specifically, the value by which extrinsic $C_{bc}$ 250 and extrinsic $C_{bc}$ 252 are lowered is proportional to the thickness of dielectric segment 260 and dielectric segment 262, respectively. The greater the thickness of dielectric segment 260 and dielectric segment 262, the greater the reduction in capacitance achieved. This reduction in extrinsic $C_{bc}$ 250 and extrinsic $C_{bc}$ 252 leads to a reduction in the total $C_{bc}$ for the silicon-germanium HBT.

It can be further deduced from Equation (1) above that the dielectric constant k, of the dielectric material separating the two plates also affects the capacitance value. If the dielectric material has a high k the capacitance value will be higher. Thus, selection of the appropriate dielectric material becomes an important step in fabrication of the silicon-germanium HBT.

In the present embodiment of the invention, dielectric segment 260 and dielectric segment 262 are comprised of silicon dioxide which has a dielectric constant of approximately 4.0. Alternatively, if dielectric segment 260 and dielectric segment 262 were comprised of a different material, for example a suitable low-k dielectric, the total capacitance would be lower. For instance, some low-k dielectric material have a dielectric constant of approximately 2.0 which, when used as dielectric segments 260 and 262, would lower the extrinsic component of the total $C_{bc}$. Examples of low-k dielectric materials that may be used in the present invention to fabricate dielectric segments 260 and 262 are: porous silica (with a dielectric constant of 1.2 to 2.3), fluorinated amorphous carbon (with a dielectric constant of 2.0 to 2.6), fluoro-polymer (with a dielectric constant of 1.9 to 2.0), parylene (with a dielectric constant of 2.2 to 2.9), polyarylene ether (with a dielectric constant of 2.6 to 2.8), silsesquioxane (with a dielectric constant of 2.5 to 3.0), fluorinated silicon dioxide (with a dielectric constant of 3.2 to 3.6), and diamond-like carbon (with a dielectric constant of 2.4 to 2.8). All of these dielectrics have a dielectric constant below the widely used dielectrics silicon dioxide (having a dielectric constant of approximately 4.0) and silicon nitride (having a dielectric constant of approximately 7.0). Manifestly, if the dielectric material used has a higher k than silicon dioxide, the capacitance value would be proportionately raised. Hence, by fabricating dielectric segments 260 and 262 from a low-k dielectric it is possible to reduce the extrinsic component of the total $C_{bc}$.

It is appreciated by the above detailed disclosure that this invention provides a method for fabrication of a silicon-germanium heterojunction bipolar transistor in which the base to collector capacitance is lower than that found in similar devices made by conventional silicon-germanium HBT fabrication processes. Furthermore, the present invention reduces the base to collector capacitance without modifying the geometries of the active regions of the silicon-germanium HBT. As such, the performance of the silicon-germanium HBT is not adversely affected. Although the invention is described as applied to the construction of a silicon-germanium HBT, it will be apparent to a person of ordinary skill in the art how the invention can be applied in similar situations where base to collector capacitance needs to be reduced to improve transistor performance.

From the above description of the invention it is manifest that various techniques can be used for implementing the concepts of the present invention without departing from its scope. For example, as stated above, dielectric layer 261 comprises silicon dioxide but can instead comprise silicon nitride, a low-k dielectric, or other suitable dielectric material. Moreover, although dielectric layer 261 has been described as being between approximately 2000 and approximately 3000 Angstroms thick, it is noted that other embodiments of the invention can be practiced where such dielectric layer is of a different thickness, depending on, for example, what dielectric material is used. Additionally, although the description has been directed to an N type emitter, a P type base, and an N type collector, thus forming an NPN device, the invention is equally applicable to, for example, a PNP device. The described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for reducing base to collector capacitance and related structure have been described.

What is claimed is:

1. A method comprising steps of:

opening a transistor region adjacent a first oxide region in a semiconductor substrate, said transistor region including an intrinsic collector region and a first extrinsic collector region, said intrinsic collector region being situated directly adjacent to said first extrinsic collector region;

depositing a blanket layer of dielectric over said transistor region and over said first oxide region;

etching away said blanket layer of dielectric from said transistor region;

growing a base region over said intrinsic collector region and growing a first conductive region over said first oxide region, wherein said first conductive region is electrically shorted to said base region.

2. The method of claim 1 further comprising a step of fabricating an emitter region on said base region.

3. The method of claim 1 wherein said opening step comprises opening said transistor region between said first oxide region and a second oxide region.

4. The method of claim 3 wherein said growing step further comprises growing a second conductive region over said second oxide region, wherein said second conductive region is electrically shorted to said base region.

5. The method of claim 4 further comprising a step of forming a first extrinsic collector region under said first oxide region and forming a second extrinsic collector region under said second oxide region prior to said opening step.

6. The method of claim 4 further comprising a step of fabricating an emitter region on said base region.

7. The method of claim 1 wherein said blanket layer of dielectric is selected from the group consisting of silicon dioxide, silicon nitride, and a low-k dielectric.

8. The method of claim 3 wherein said first oxide region and said second oxide region are selected from the group consisting of field oxide, shallow trench oxide, and LOCOS.

9. The method of claim 1 wherein said first oxide region is selected from the group consisting of field oxide, shallow trench isolation, and LOCOS.

10. The method of claim 1 wherein said base region comprises silicon-germanium.

11. A structure comprising:

an intrinsic collector region;

a first extrinsic collector region, said first extrinsic collector region being situated directly adjacent to said intrinsic collector region;

a first oxide region situated on top of said first extrinsic collector region;

a first dielectric segment situated on top of said first oxide region; and a first conductive region located on top of said first dielectric segment, said first conductive region being connected to a base region in a transistor.

12. The structure of claim 11 wherein said first dielectric segment is selected from the group consisting of silicon dioxide, silicon nitride, and a low-k dielectric.

13. The structure of claim 11 wherein said first conductive region is electrically connected to said base region.

14. The structure of claim 11 further comprising an emitter region situated on top of said base region.

15. The structure of claim 11 wherein said first oxide region is selected from the group consisting of field oxide, shallow trench isolation, and LOCOS.

16. The structure of claim 11 wherein said base region comprises silicon-germanium.

17. The structure of claim 11 further comprising:

a second extrinsic collector region;

a second oxide region situated on top of said second extrinsic collector region;

a second dielectric segment situated on top of said second oxide region; and a second conductive region located on top of said second dielectric segment, said second conductive region being connected to said base region in said transistor.

18. The structure of claim 17 wherein said first dielectric segment and said second dielectric segment are selected from the group consisting of silicon dioxide, silicon nitride, and a low-k dielectric.

19. The structure of claim 17 wherein said base region comprises silicon-germanium.

20. The structure of claim 17 further comprising an emitter region situated on top of said base region.

21. The structure of claim 17 wherein said first oxide region and said second oxide region are selected from the group consisting of field oxide, shallow trench isolation, and LOCOS.

22. The structure of claim 17 wherein said first conductive region and said second conductive region are electrically connected to said base region.

* * * * *